Figure 1:
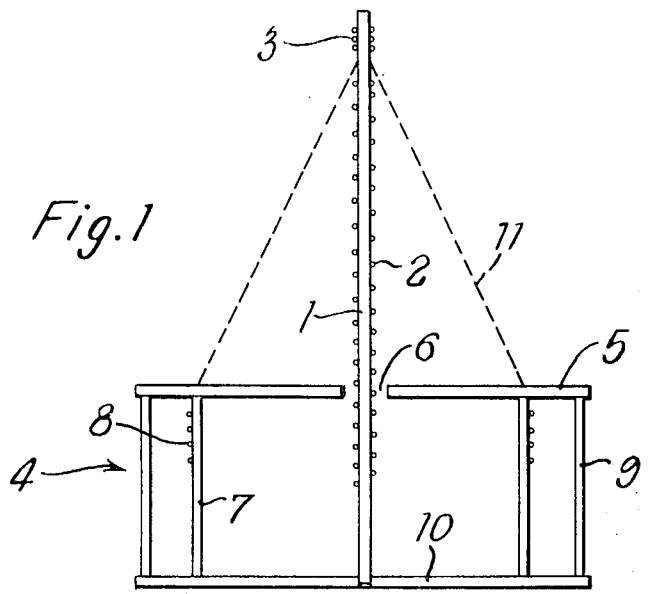

United States Patent

Spurr et al.

[11] 3,953,791
[45] Apr. 27, 1976

[54] APPARATUS FOR AND METHOD FOR TESTING THE NUMBER OF TURNS ON A COIL

[75] Inventors: Ronald Frederick Spurr, Sevenoaks; Colin Alan Boardman, Shirley; John D. Yewen, Croydon, all of England

[73] Assignee: H. Tinsley & Co. Ltd., London, England

[22] Filed: June 14, 1974

[21] Appl. No.: 479,567

[30] Foreign Application Priority Data
June 19, 1973 United Kingdom............... 29011/73

[52] U.S. Cl.................................. 324/34 R; 324/55
[51] Int. Cl.² ........................................ G01R 33/00
[58] Field of Search............................ 324/34 R, 55

[56] References Cited
UNITED STATES PATENTS

| | | | |
|---|---|---|---|
| 2,227,029 | 12/1940 | Schlesinger | 324/34 R |
| 2,432,948 | 12/1947 | Thompson | 324/34 R |
| 2,680,835 | 6/1954 | Smith | 324/34 R |
| 2,921,255 | 1/1960 | Norton | 324/34 R |
| 3,267,370 | 8/1966 | Praeg | 324/55 |

FOREIGN PATENTS OR APPLICATIONS

| | | | |
|---|---|---|---|
| 888,892 | 2/1962 | United Kingdom | 324/55 |

*Primary Examiner*—Robert J. Corcoran
*Attorney, Agent, or Firm*—Karl W. Flocks

[57] ABSTRACT

Apparatus and method for testing the number of turns on a coil by magnetically energizing a rod through an energizing coil and with compensating coils modifying the flux about the rod to provide a space in which the flux is substantially uniform and within which space is placed the coil to be tested.

20 Claims, 2 Drawing Figures

U.S. Patent   April 27, 1976   3,953,791

APPARATUS FOR AND METHOD FOR TESTING THE NUMBER OF TURNS ON A COIL

This invention relates to improvements in apparatus for and method of testing the number of turns on a coil.

The number of turns of wire on a coil, such as is used on small transformers and chokes, may be determined by comparing the voltage induced in the coil with a reference voltage which may or may not be derived from a reference coil of a known number of turns. One of the difficulties in making the measurement on a commercial scale is that the coils being measured may have different dimensions from each other and also different dimensions with respect to the reference coil if a reference coil is used for comparison purposes. The coils will therefore enclose more or less less flux as the case may be and the accuracy of the measurement is seriously impared unless elaborate shielding methods are employed with consequent increase in cost and difficulties in handling.

It is an object of the present invention to provide an improved apparatus for and method of testing the number of turns on a coil which apparatus shall be economic to manufacture, easy to use, and provide an acceptable accuracy of measurement.

According to one aspect of the present invention there is provided apparatus for testing the number of turns on a coil comprising a rod capable of being magnetically energised, an energising coil associated with the rod and capable of being energised magnetically to energise the rod to generate flux, at least two compensation coils associated with the rod and spaced axially thereof and capable of being energised to modify the flux in the sense to provide between the coils and about the rod a space in which the flux is substantially uniform and means for supporting within said space a coil to be tested.

Since, in any given range of coil size, the coil to be tested may be long in the axial direction but of small outer diameter, or short in the axial direction but of large outer diameter, it is preferred that the compensating coils are such that the space in which the flux is substantially uniform should be substantially of circular cross-section in a plane normal to the rod axis and should be of decreasing diameter in one direction of the rod axis. The space may be considered to be of approximately conical shape.

Advantageously therefore, one compensating coil is of considerably smaller outer diameter than the other and desirably is of such an outer diameter that a coil to be tested can be slipped thereover to the support means.

In a preferred embodiment, the energising coil is wound about the rod and the one compensating coil is also wound about the rod towards one end thereof to an outer diameter not greater than that of the energising coil so that any coil to be tested which can pass over that part of the rod wound with the energising coil can freely pass over the one compensating coil to the support means. With advantage, the rod with the one compensating coil and the energising coil can be encased in a plastics material to give a unitary article to be received in a stand comprising the support means and the other compensating coil.

Desirably, the apparatus includes, in combination, means for energising the energising coil and the compensating coils, means for deriving a measure of the voltage induced in a coil supported on the support means and comparison means operable to compare the induced voltage with a reference voltage to provide a measure of the number of turns of the coil supported in the support means.

Advantageously, correcting means is provided responsive to fluctuations in the energising means to modify the reference voltage in the sense to compensate for such fluctuations.

According to another embodiment of the present invention there is provided a method of testing the number of turns on a coil which comprises magnetically energising a rod to provide a space about the rod in which the flux is substantially uniform, the space being of reducing circular cross-section in the direction of the rod axis and deriving a measure of the voltage induced in a coil under test located within said space.

Preferably, the derived voltage is compared with a reference voltage to derive a measure of the number of turns of the coil under test.

Advantageously, the reference voltage is modified in response to variations in the energisation of the rod to compensate therefore.

Figure 2:
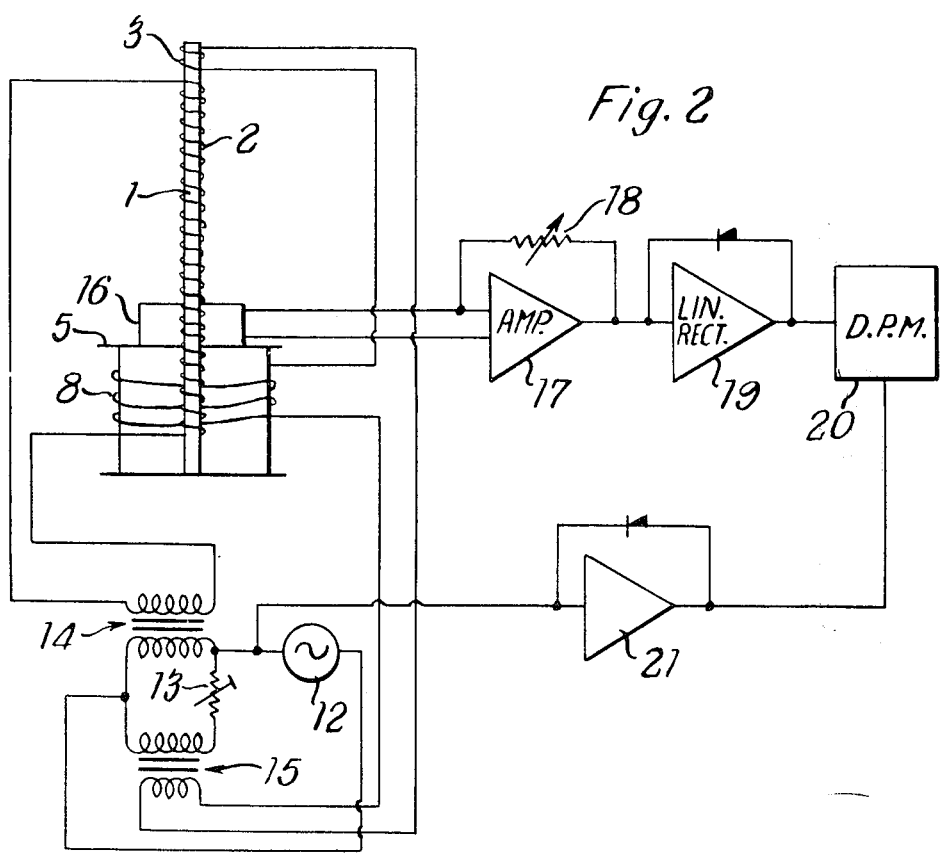

One embodiment of the present invention and a modification thereof will now be described by way of example, reference being made to the accompanying drawings in which:

FIG. 1 is a diagrammatic view of an apparatus according to the present invention, and FIG. 2 is a circuit diagram showing the apparatus of FIG. 1 connected in use.

The apparatus shown in FIG. 1 comprises a soft iron rod 1 linearly wound for the major part of its length with an energising coil 2. The energising coil 2 stops short of one end of the rod 1 (the upper end as seen in FIG. 1) and around this upper end is wound a first compensating coil 3 which may be several turns thick and of thinner wire than the energising coil 2 so that its outer diameter is not greater than that of the energising coil 2. The rod 1, energising coil 2 and compensating coil 3 are covered in a plastics material (not shown) to form a unitary article. A stand indicated generally at 4 is provided and comprises a circular support plate 5 of plastics material with a central aperture 6 and a cylindrical depending skirt 7 of lesser diameter than the support plate 5. A second compensating coil 8 is wound about the skirt 7 and the latter is surrounded by an outer cylindrical skirt 9 connected to a base plate 10 and the support plate 5. The compensating coil 8 has an inner diameter considerably larger than the outer diameter of the coils 2 and 3. The rod 1 passes through the aperture 6 and its lower end may be threaded to engage in the base plate 10 although it may be otherwise located. The lower end of the energising coil 2 extends below the support plate 5 and it is preferred that at least one quarter of the axial length of the energising coil 2 should extend below the plane normal to the rod axis and containing the top winding of the compensating coil 8. Because the rod 1 together with the energising coil 2 and compensating coil 3 is a unitary article which is detachable from the stand 4, a set of several such rods may be provided for use with stand depending upon the size of the coils to be measured.

It is recognised that the flux generated by energising the coil 2 does not have the uniform spatial distribution required for the purpose in view because of leakage flux between the ends of the rod 1. It will be appreciated that with the apparatus described, all the coils are coaxial with the rod 1 and that by energising the compensating coils 3 and 8, the leakage flux within a space about the rod axis 1 can be neutralised so that this space has a circular cross-section which is of reducing diameter in the direction extending from the coil 8 to the coil 3. This space may be considered to approximate to a cone as shown in dotted lines at 11 and will receive coils to be tested which are long and thin or short and thick. Also, any coil which will pass over the energising coil 2 will pass over the compensating coil 3 so that coils to be tested may be slipped over the upper end of the rod 1 to the support plate 5 in rapid sequence and the measurement noted without the apparatus requiring any parts to be removed and without any skill being required. In use, the apparatus described with reference to FIG. 1 is associated with an alternating voltage source 12 (FIG. 2) which supplies, through a tapped resistor 13, two transformers 14 and 15 which respectively supply the energising coil 2 and the compensating coils 3 and 8, the latter being series connected and one of them being preferably tapped to enable the ratio of the coils 3 and 8 to be adjusted. The tapped resistor 13 enables the voltages supplied to the energising coil 2 and the compensating coils 3 and 8 to be adjusted relative to each other and this, together with the adjustment of the ratio of the coils 3 and 8 enables the apparatus to be set up with the space of uniform flux approximately indicated by the dotted line 11 of FIG. 1. When this has been done, a reference coil 16 of known parameters is slipped over the upper end of the rod 1 to be supported on the support 5 which defines a reference plane. The voltage induced in the reference coil 16 is supplied to an amplifier 17 having an associated variable resistor 18 which enables various voltage ranges to be selected. The output from the amplifier 17 is supplied through a linear rectifier 19 to a digital panel meter 20 which provides a convenient display. There is now derived a reference voltage from the reference coil 16 and this is stored in the meter 20. The reference coil 16 is now replaced by a coil to be tested and the voltage induced in the coil under test is compared with the reference voltage in the meter 20 which, as a result of the comparison, displays a signal representing the number of turns of the coil under test. In setting up the apparatus the meter 20 may be adjusted to display the known number of turns of the reference coil 16 so that the meter is effectively calibrated by equating the desired reference voltage with the displayed known number of turns. Subsequently, the induced voltage in a coil under test will automatically display on the meter 20 the number of turns of the coil. Thus, in batch production, the manufactured coils could successively be placed on the support plate 5 and the meter 20 would show whether the coil under test was manufactured within the required turns tolerance.

Because of possible fluctuations in the supply voltage, the system described would require to be checked from time to time against a reference coil. This can be obviated by connecting the voltage source 12 through a linear rectifier 21 to the digital panel meter 20 to modify the reference voltage stored there in accordance with fluctuations of the supply and in the sense to nullify the effect of such fluctuations. The measurement then becomes one of ratio rather than absolute voltage so that the effect of fluctuations is removed.

As will be understood, a digital panel meter operates from a voltage source so that by using the same voltage source for the meter reference as is used for energising the coils 2, 3 and 8, the effect of supply variations is removed.

It will be appreciated that the dimensions of the rod 1 and the compensating coils 3 and 8 will depend upon the size of the coils to be tested. However, three sizes of rod 1 with associated sealed compensating coil 3 will cover most miniature, small and medium size coils currently in production. Three sizes of rod may thus be provided for use with a single stand 4 and associated equipment, thus making for economy and convenience.

Alternatively, each size of rod may be permanently fitted to a stand of appropriate dimensions according to the method of use.

What is claimed is:

1. Apparatus for testing the number of turns on a coil comprising a rod capable of being magnetically energized, an energizing coil wound on the rod and connected to magnetically energize the rod to generate flux, at least two compensating coil means coaxially spaced axially along the rod and adapted to be energized to modify the flux in the sense to provide between the compensating coil means and about the rod a space in which the flux is substantially uniform, and support means about the rod for supporting within said space a coil to be tested.

2. Apparatus according to claim 1 wherein said compensating coil means when energized form a space between them in which the flux is substantially uniform and substantially of circular cross-section in a plane normal to the rod axis and of decreasing diameter in one direction of the rod axis.

3. Apparatus according to claim 1 in which one compensating coil means is of smaller outer diameter than the other.

4. Apparatus according to claim 3 in which the one compensating coil means is axially spaced from the support means and its outer diameter is selected to be such as to allow a coil to be tested to be slipped thereover and over the rod to a position where the coil to be tested rests on the support means.

5. Apparatus according to claim 3 in which the energizing coil is wound about the rod and the one compensating coil means is also wound about the rod towards one end thereof to an outer diameter not greater than that of the energizing coil with any coil to be tested which can pass over that part of the rod wound with the energizing coil freely passing over the one compensating coil means to rest on the support means.

6. Apparatus according to claim 3 in which the rod with the one compensating coil means and the one energizing coil are encased in a plastics material to provide a unitary article.

7. Apparatus according to claim 3 in which the support means forms part of a stand which includes a cylindrical skirt about which the other compensating coil means is wound.

8. Apparatus according to claim 7 in which the rod extends through the support means with said one and said other compensating coil means located on opposite sides of the rod.

9. Apparatus according to claim 8 in which the rod extends through the support means by a distance such that at least one quarter of the axial length of the energizing coil extends beyond the plane normal to the rod axis containing that winding of said other compensating coil means which is nearest said support means.

10. Apparatus according to claim 7 in which the rod is located in a base plate connected to the support means.

11. Apparatus according to claim 10 in which the base plate is connected to the support means by an outer cylindrical skirt surrounding the cylindrical skirt about which said other compensating coil means is wound.

12. Apparatus according to claim 1 in which the two compensating coil means are series connected.

13. Apparatus according to claim 1 in combination with means for energizing the energizing coil and the compensating coil means, means for deriving a measure of the voltage induced in a coil supported on the support means and comparison means operable to compare the induced voltage with a reference voltage to provide a measure of the number of turns of the coil supported in the support means.

14. Apparatus according to claim 13 in which the energizing means comprises an alternating voltage source which supplies a tapped resistor and two transformers one of which supplies the energizing coil and the other of which supplies the compensating coil means.

15. Apparatus according to claim 13 in which the means for deriving a measure of the induced voltage comprises an amplifier connected through a linear rectifier to a digital panel meter.

16. Apparatus according to claim 15 in which the digital panel meter is energized by the means for energizing the energizing coil and the compensating coil means.

17. A method of testing the number of turns on a coil which comprises magnetically energizing a rod to generate flux and modifying the generated flux by simultaneously generating compensating flux from axially spaced locations along the rod to provide a space about the rod in which the flux is substantially uniform, the space being of reducing circular cross-section in the direction of the rod axis and deriving a measure of the voltage induced in a coil under test located within said space.

18. A method according to claim 17 in which the derived voltage is compared with a reference voltage to derive a measure of the number of turns of the coil under test.

19. A method according to claim 18 in which the reference voltage is modified in response to variations in the energization of the rod to compensate therefore.

20. A method according to claim 18 in which the induced voltage is measured by a digital panel meter calibrated as a function of the voltage induced in coil of known number of turns.

* * * * *